United States Patent
Fujiwara (10) Patent No.: US 7,667,961 B2
(45) Date of Patent: Feb. 23, 2010

(54) ELECTRONIC APPARATUS

(75) Inventor: Nobuto Fujiwara, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/192,863

(22) Filed: Aug. 15, 2008

(65) Prior Publication Data

US 2009/0052131 A1    Feb. 26, 2009

(30) Foreign Application Priority Data

Aug. 24, 2007  (JP) .............................. 2007-218765

(51) Int. Cl.
*H05K 7/20*  (2006.01)
(52) U.S. Cl. ............................. 361/679.47; 361/679.55; 361/688; 361/690; 361/695; 361/696; 165/80.2; 165/80.3; 165/80.5; 165/104.21; 165/104.26; 165/104.33
(58) Field of Classification Search ............. 361/679.46, 361/679.47, 679.48, 679.52, 679.55, 688; 361/690–697, 717–724; 165/80.2, 80.3, 165/80.4, 80.5, 104.21, 104.26, 104.33, 121; 165/122, 185; 454/184; 174/15.2, 16.3, 174/252; 62/259.2
See application file for complete search history.

(56) References Cited

U.S. PATENT DOCUMENTS 6,315,655 B1 * 11/2001 McEwan et al. ............ 454/184
6,771,497 B2 * 8/2004 Chen et al. ............. 361/679.47
6,804,115 B2 * 10/2004 Lai ............................ 361/695
6,847,524 B2 * 1/2005 Tomioka et al. ............. 361/695
7,123,484 B2 * 10/2006 Tsai ........................... 361/719
7,474,526 B2 * 1/2009 Fujiwara ................ 165/104.21
2005/0094371 A1 * 5/2005 Lai ............................. 361/687

FOREIGN PATENT DOCUMENTS

| JP | 3-113893 | 11/1991 |
|---|---|---|
| JP | 2000-349482 | 12/2000 |
| JP | 3104491 | 9/2004 |
| JP | 3637304 | 1/2005 |

* cited by examiner

*Primary Examiner*—Michael V Datskovskiy
(74) *Attorney, Agent, or Firm*—Blakely, Sokoloff, Taylor & Zafman LLP (57) ABSTRACT

According to one embodiment, an electronic apparatus is provided with a case, a printed circuit board which is contained in the case and includes a first surface and a second surface formed on the side opposite from the first surface, a first heating element mounted on the first surface, a second heating element mounted on the second surface, a first cooling fan used to cool the first heating element, and a second cooling fan used to cool the second heating element. A thickness of the second cooling fan is smaller than a thickness of the first cooling fan. The second cooling fan is mounted so as to overlap the first cooling fan in a direction parallel to the first surface of the circuit board and be situated within a range of the thickness of the first cooling fan.

9 Claims, 7 Drawing Sheets

ELECTRONIC APPARATUS

CROSS-REFERENCE TO RELATED APPLICATIONS

This application is based upon and claims the benefit of priority from Japanese Patent Application No. 2007-218765, filed Aug. 24, 2007, the entire contents of which are incorporated herein by reference.

BACKGROUND

1. Field

One embodiment of the invention relates to an electronic apparatus with a cooling structure.

2. Description of the Related Art

An electronic apparatus, such as a portable computer, is mounted with heating elements, e.g., a CPU, and is provided with a cooling structure for cooling the heating elements.

A cooling structure for cooling heating elements that are mounted on the obverse and reverse surfaces of a board is described in Jpn. UM Appln. KOKAI Publication No. 3-113893. This cooling structure is provided with a plurality of cooling units that include radiators and fans, and the cooling units are attached to the heating elements, individually. Thus, cooling of the heating elements on the obverse and reverse surfaces of the board can be accelerated.

Described in the specification of Japanese Patent No. 3637304 is a cooling device that is provided with a heat sink, an auxiliary heat sink, and a cooling fan. The heat sink is in contact with a heating element on a circuit board. The auxiliary heat sink receives heat from the main heat sink. The cooling fan is used to cool the auxiliary heat sink. A case of the cooling fan includes an end face portion that protrudes from the circuit board on a side opposite to the side where the heat sink is situated. A part of the circuit board is situated between the end face portion and a heating element contact surface of the heat sink.

There is an increasing demand for thinner electronic apparatuses. On the other hand, heat release from components that are mounted in the electronic apparatuses is increasing year by year. Electronic apparatuses of the future are expected to be each mounted with a plurality of heating elements that require cooling. Since one such electronic apparatus may be provided with a large-sized cooling structure or a plurality of cooling structures for cooling the heating elements, it cannot readily meet the requirement for further thinness.

If the cooling units are attached individually to the heating elements that are mounted on the obverse and reverse surfaces of the board, as described in Jpn. UM Appln. KOKAI Publication No. 3-113893, it is difficult to reduce the thickness of the electronic apparatus. While the cooling device described in the specification of Japanese Patent No. 3637304 has a structure suited for one heating element that is mounted on the circuit board, it never contributes to the thinning of the electronic apparatus that is mounted with a plurality of heating elements.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, an electronic apparatus is provided with a case, a printed circuit board which is contained in the case and includes a first surface and a second surface formed on the side opposite from the first surface, a first heating element mounted on the first surface, a second heating element mounted on the second surface, a first cooling fan used to cool the first heating element, and a second cooling fan used to cool the second heating element. A thickness of the second cooling fan is smaller than a thickness of the first cooling fan. The second cooling fan is mounted so as to overlap the first cooling fan in a direction parallel to the first surface of the circuit board and be situated within a range of the thickness of the first cooling fan.

Figure 1:
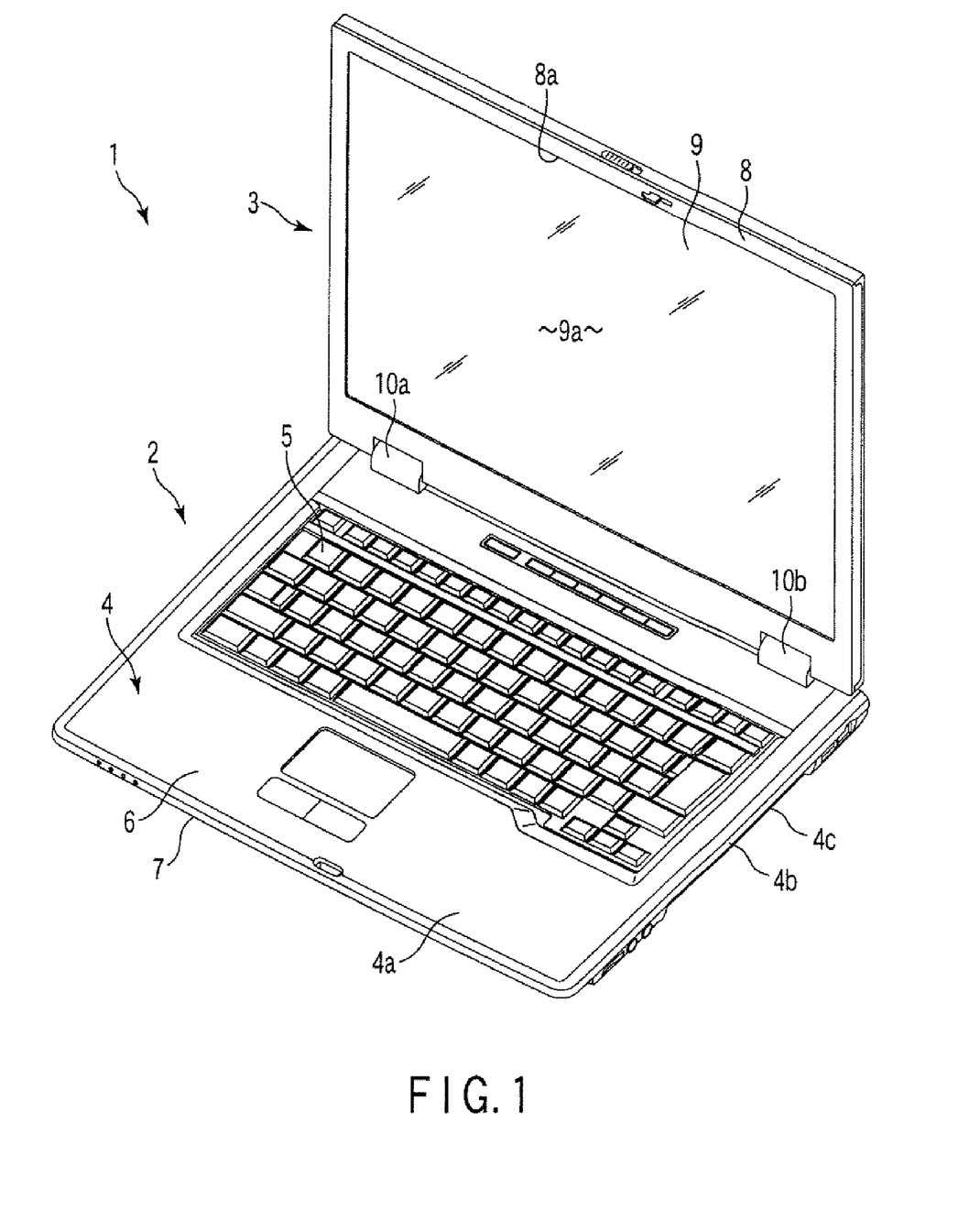
FIG. 1 is an exemplary perspective view of a portable computer according to a first embodiment of the invention.
Figure 2:
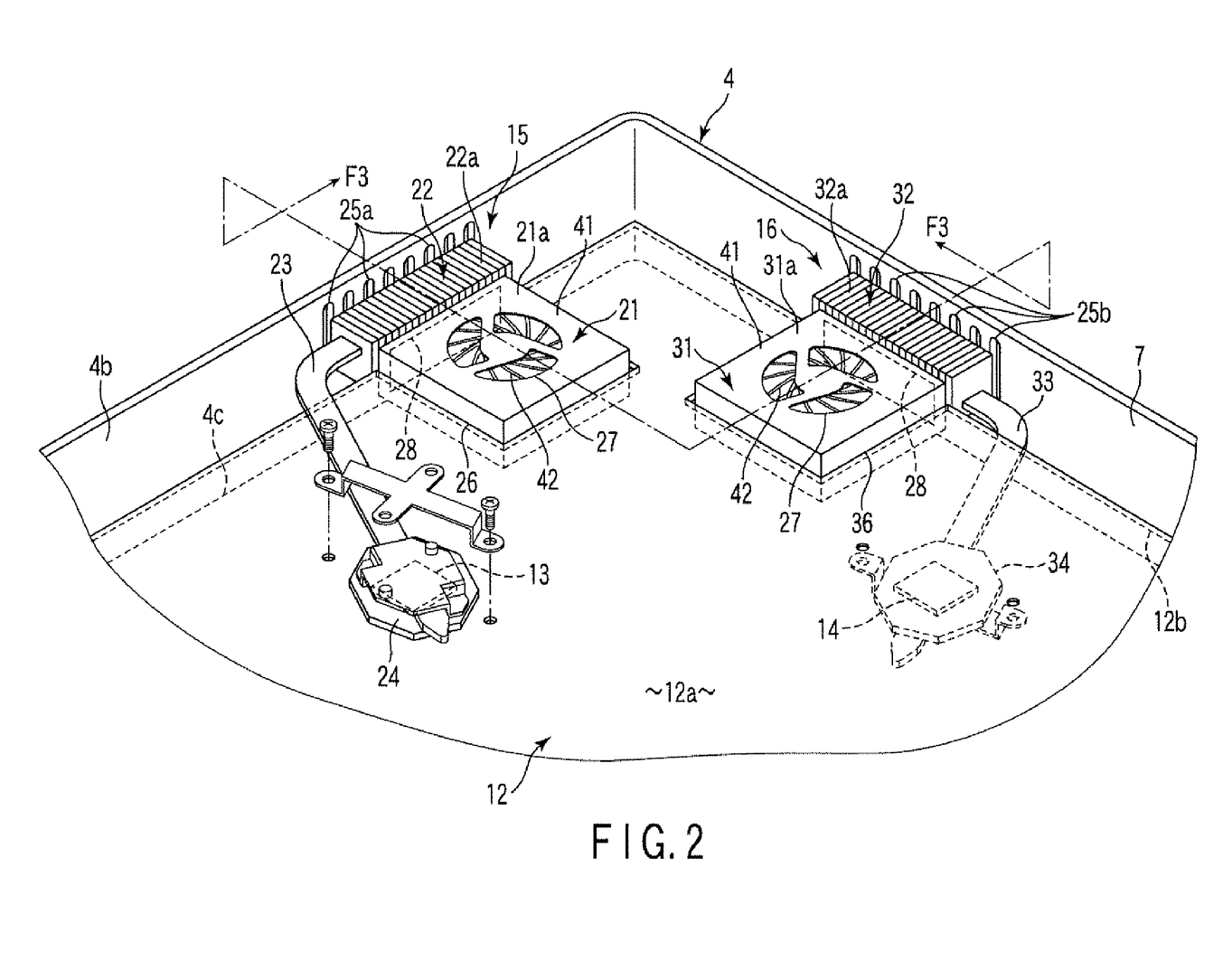
FIG. 2 is an exemplary perspective view of the interior of the portable computer shown in FIG. 1.
Figure 3:
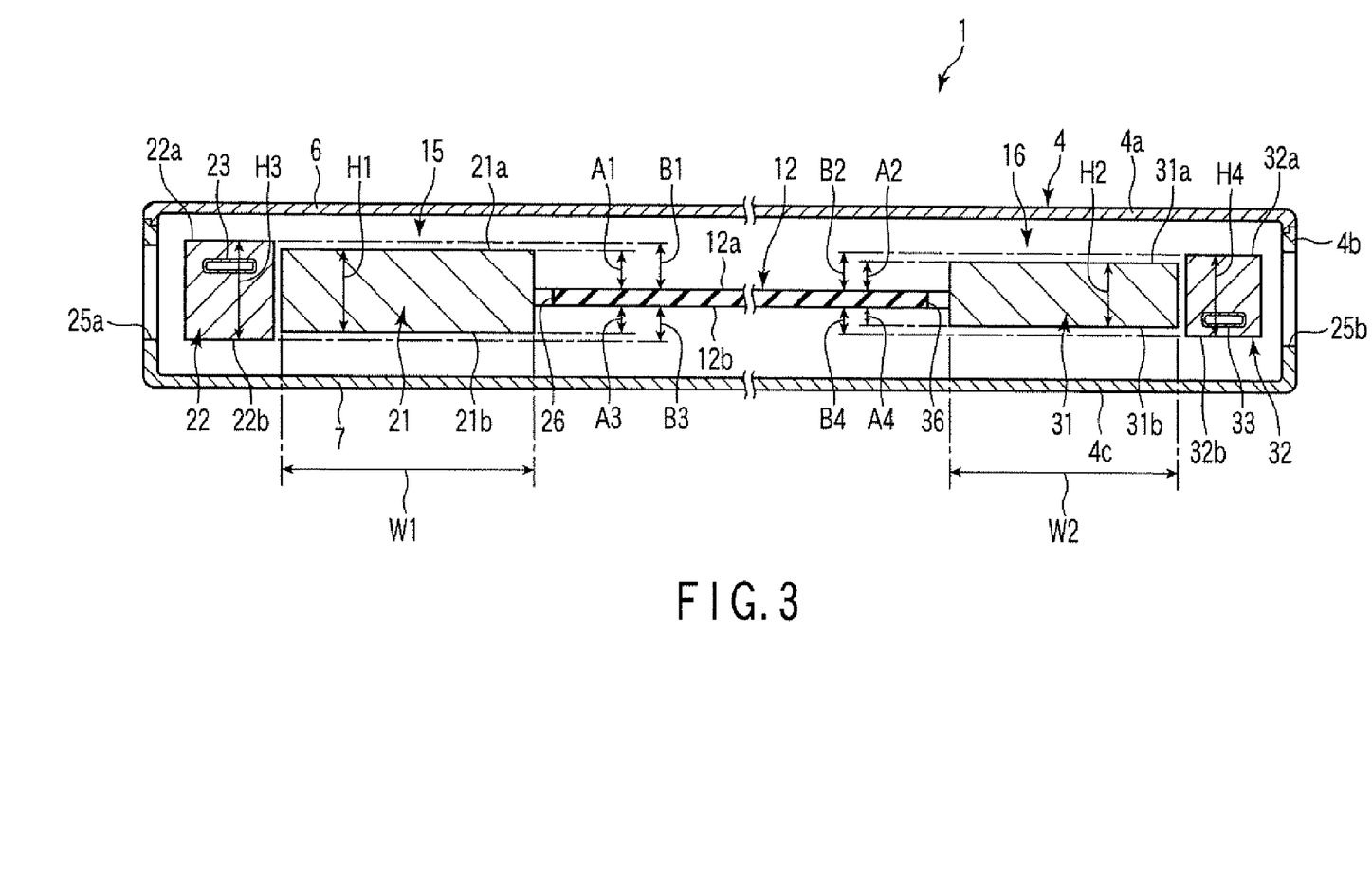
FIG. 3 is an exemplary sectional view of the portable computer taken along line F3-F3 of FIG. 2.

Embodiments of the present invention that are applied to portable computers will now be described with reference to the accompanying drawings. FIGS. 1 to 3 show a portable computer 1 as an electronic apparatus according to a first embodiment of the invention. FIG. 1 shows an outline of the portable computer 1. As shown in FIG. 1, the portable computer 1 is provided with a main body 2 and a display unit 3. The main body 2 includes a box-shaped case 4.

The case 4 is provided with a top wall 4a, a peripheral wall 4b, and a bottom wall 4c. The top wall 4a supports a keyboard 5. The case 4 is provided with a case cover 6 that includes the top wall 4a and a case base 7 that includes the bottom wall 4c. The case cover 6 is assembled to the case base 7 from above, whereby a storage space is defined between the cover 6 and the base 7.

As shown in FIG. 1, the display unit 3 is provided with a display housing 8 and a display 9 contained in the housing 8. The display 9 includes a display screen 9a. The screen 9a is exposed to the outside of the display housing 8 through an opening 8a in the front face of the housing 8.

The display unit 3 is supported on a rear end portion of the case 4 by a pair of hinge portions 10a and 10b. Thus, the display unit 3 is swingable between a closed position in which it is brought down so as to cover the top wall 4a from above and an open position in which it stands so that the top wall 4a is exposed.

FIGS. 2 and 3 show the interior of the case 4. As shown in FIG. 2, the case 4 contains a circuit board 12. As shown in FIG. 3, the circuit board 12 includes a first surface 12a and a second surface 12b that is formed on the side opposite from the first surface 12a. The first surface 12a is an obverse surface, for example, opposed to the top wall 4a, while the second surface 12b is a reverse surface, for example, opposed to the bottom wall 4c. These surfaces are not limited to this arrangement, but may alternatively be arranged so that the first and second surfaces 12a and 12b are reverse and obverse surfaces, respectively, for example.

As shown in FIG. 2, a first heating element 13 is mounted on the first surface 12a of the circuit board 12. A second heating element 14 is mounted on the second surface 12b of the circuit board 12. The first and second heating elements 13 and 14 are heating components that are individually mounted on, for example, the circuit board 12 and generate heat when activated for use. Specific examples of the heating components include a CPU, graphic chip, Northbridge (trademark), memory, etc. However, the first and second heating elements 13 and 14 are not limited to the above examples, but may possibly be various other components that require heat radiation.

In the present embodiment, the first heating element 13, for example, is higher in heat release rate (i.e., heat output) than the second heating element 14. In other words, the energy consumption of the first heating element 13 is larger than that of the second heating element 14. Further, the heating elements 13 and 14 are deviated from each other in a direction perpendicular to the surfaces 12a and 12b of the circuit board 12 (e.g., vertically).

As shown in FIG. 2, the portable computer 1 is provided with cooling units of the remote heat exchanger (RHE) type for the first and second heating elements 13 and 14, individually.

Specifically, a first cooling unit 15 for cooling the first heating element 13 includes a first cooling fan 21, first radiator 22, first thermal transfer member 23, and first heat receiving plate 24. The first heat receiving plate 24 faces the first heating element 13 from above the circuit board 12, and is thermally connected to the first heating element 13 by means of a thermally conductive member, such as a thermal transfer sheet or grease.

As shown in FIG. 2, first and second exhaust holes 25a and 25b open in the peripheral wall 4b of the case 4. The first radiator 22 is mounted extending along the first exhaust holes 25a. The first thermal transfer member 23 is, for example, a heat pipe, which extends so as to face the first surface 12a of the circuit board 12. The first thermal transfer member 23 is extended between the first radiator 22 and the first heat receiving plate 24. Thus, the first radiator 22 is thermally connected to the first heating element 13 by the first thermal transfer member 23 and the first heat receiving plate 24 so that it can receive heat from the heating element 13.

As shown in FIGS. 2 and 3, the first cooling fan 21 is located opposite the first radiator 22. It is used to cool the first heating element 13. The first cooling fan 21 includes a fan case 41 and an impeller 42 that is contained in the fan case 41 and driven for rotation. At least a part of the fan case 41 may be formed of the case 4.

The first cooling fan 21 is located extending parallel to the surfaces 12a and 12b of the circuit board 12. The fan 21 is formed having, for example, a flat shape and mounted so that its longitudinal axis is parallel to the surfaces 12a and 12b of the circuit board 12.

Thus, a width W1 of the first cooling fan 21 parallel to the surfaces 12a and 12b of the circuit board 12 is larger than a thickness H1 perpendicular to the surfaces 12a and 12b. The fan 21 is located so that a rotating shaft of the impeller 42 extends at right angles to the surfaces 12a and 12b of the circuit board 12.

The circuit board 12 is provided with a first cut-off portion 26 along the contour of the first cooling fan 21, for example. The first cooling fan 21 is confined within the first cut-off portion 26 and arranged with the circuit board 12 in the direction parallel to the surfaces 12a and 12b of the circuit board 12, as shown in FIG. 3. Specifically, the first cooling fan 21 includes an upper surface 21a and a lower surface 21b, which are opposed to the top wall 4a and the bottom wall 4c, respectively. A part of the circuit board 12 is situated between the upper and lower surfaces 21a and 21b. The upper surface 21a is the widest flat surface of the fan case 41, for example. The first cooling fan 21 is located so that the upper surface 21a extends parallel to the surfaces 12a and 12b of the circuit board 12.

The first cooling fan 21 is provided with a suction port 27 that opens into the case 4 and a discharge port 28 that faces the first radiator 22. The fan 21 draws in air from the case 4 through the suction port 27 and discharges the drawn-in air toward the first radiator 22 through the discharge port 28. By doing this, the first cooling fan 21 cools the radiator 22.

Likewise, a second cooling unit 16 for cooling the second heating element 14 includes a second cooling fan 31, second radiator 32, second thermal transfer member 33, and second heat receiving plate 34. The second heat receiving plate 34 faces the second heating element 14 from below the circuit board 12, and is thermally connected to the second heating element 14 by means of a thermally conductive member.

The second radiator 32 is mounted extending along the second exhaust holes 25b. The second thermal transfer member 33 is, for example, a heat pipe, which extends so as to face the second surface 12b of the circuit board 12. The second thermal transfer member 33 is extended between the second radiator 32 and the second heat receiving plate 34. Thus, the second radiator 32 is thermally connected to the second heating element 14 by the second thermal transfer member 33 and the second heat receiving plate 34 so that it can receive heat from the heating element 14.

As shown in FIGS. 2 and 3, the second cooling fan 31 is located opposite the second radiator 32. It is used to cool the second heating element 14. The second cooling fan 31 includes a fan case 41 and an impeller 42 that is contained in the fan case 41 and driven for rotation. At least a part of the fan case 41 may be formed of the case 4.

The second cooling fan 31 is located extending parallel to the surfaces 12a and 12b of the circuit board 12. The fan 31 is formed having, for example, a flat shape and mounted so that its longitudinal axis is parallel to the surfaces 12a and 12b of the circuit board 12.

Thus, a width W2 of the second cooling fan 31 parallel to the surfaces 12a and 12b of the circuit board 12 is larger than a thickness H2 perpendicular to the surfaces 12a and 12b. The fan 31 is located so that a rotating shaft of the impeller 42 extends at right angles to the surfaces 12a and 12b of the circuit board 12.

The circuit board 12 is provided with a second cut-off portion 36 along the contour of the second cooling fan 31, for example. The second cooling fan 31 is confined within the second cut-off portion 36 and arranged with the circuit board 12 in the direction parallel to the surfaces 12a and 12b of the circuit board 12, as shown in FIG. 3. Specifically, the second cooling fan 31 includes an upper surface 31a and a lower surface 31b, which are opposed to the top wall 4a and the bottom wall 4c, respectively. A part of the circuit board 12 is situated between the upper and lower surfaces 31a and 31b. The upper surface 31a is the widest flat surface of the fan case 41, for example. The second cooling fan 31 is located so that the upper surface 31a extends parallel to the surfaces 12a and 12b of the circuit board 12.

The second cooling fan 31 is provided with a suction port 27 that opens into the case 4 and a discharge port 28 that faces the second radiator 32. The fan 31 draws in air from the case 4 through the suction port 27 and discharges the drawn-in air toward the second radiator 32 through the discharge port 28. By doing this, the second cooling fan 31 cools the radiator 32.

The second cooling fan 31 has a thickness equal to or smaller than that of the first cooling fan 21. According to the present embodiment, as shown in FIG. 3, for example, the thickness H2 of the second cooling fan 31 is smaller than the thickness Hi of the first cooling fan 21. The thickness as described in this specification is the smallest width of the second cooling fan among others, including the transverse width, longitudinal width, and depth. For example, it is a width in the direction along the axis of the rotating shaft of the impeller 42. In the description of the first to third embodiments to follow, the thickness is a width perpendicular to the surfaces 12a and 12b of the circuit board 12.

The second cooling fan 31 is located so as to overlap the first cooling fan 21 in a direction (e.g., horizontally) parallel to the surfaces 12a and 12b of the circuit board 12. As shown in FIG. 3, the second cooling fan 31 is mounted so as to be situated within a range of the thickness H1 (i.e., the thickness range) of the first cooling fan 21. Thus, as viewed parallel to the surfaces 12a and 12b of the circuit board 12, a plane of projection of the second cooling fan 31 is confined within that of the first cooling fan 21 with respect to the thickness direction at the least.

More specifically, a distance A2 between the upper surface 31a of the second cooling fan 31 and the first surface 12a of the circuit board 12 is shorter than a distance A1 between the upper surface 21a of the first cooling fan 21 and the first surface 12a. A distance A4 between the lower surface 31b of the second cooling fan 31 and the second surface 12b of the circuit board 12 is shorter than a distance A3 between the lower surface 21b of the first cooling fan 21 and the second surface 12b.

In other words, the sizes and mounting height positions of the cooling fans are set so that the cooling fan (first cooling fan 21 in the present embodiment) for cooling the heating element that requires the largest energy consumption is the largest of all cooling fans in the distances between the upper surface of the cooling fan and the first surface 12a of the circuit board 12 and between the lower surface of the cooling fan and the second surface 12b of the circuit board 12.

Further, the second radiator 32 has a thickness equal to or smaller than that of the first radiator 22. According to the present embodiment, as shown in FIG. 3, for example, a thickness H4 of the second radiator 32 is smaller than a thickness H3 of the first radiator 22. The second radiator 32 is located so as to overlap the first radiator 22 in a direction parallel to the surfaces 12a and 12b of the circuit board 12.

As shown in FIG. 3, the second radiator 32 is mounted so as to be situated within a range of the thickness H3 (i.e., the thickness range) of the first radiator 22. Thus, as viewed parallel to the surfaces 12a and 12b of the circuit board 12, a plane of projection of the second radiator 32 is confined within that of the first radiator 22 with respect to the thickness direction at the least.

More specifically, a distance B2 between an upper surface 32a of the second radiator 32 and the first surface 12a of the circuit board 12 is shorter than a distance 31 between an upper surface 22a of the first radiator 22 and the first surface 12a. A distance B4 between a lower surface 32b of the second radiator 32 and the second surface 12b of the circuit board 12 is shorter than a distance B3 between a lower surface 22b of the first radiator 22 and the second surface 12b.

In other words, the sizes and mounting height positions of the radiators are set so that the radiator (first radiator 22 in the present embodiment) for cooling the heating element that requires the largest energy consumption is the largest of all radiators in the distances between the upper surface of the radiator and the first surface 12a of the circuit board 12 and between the lower surface of the radiator and the second surface 12b of the circuit board 12.

Incidentally, each of the distances A1, A2, A3, A4, B1, B2, B3, and B4 is a length in the direction perpendicular to the first and second surface 12a and 12b of the circuit board 12.

According to this arrangement, the electronic apparatus can be reduced in thickness even in the case where heating elements that require cooling are mounted individually on the obverse and reverse surfaces of the circuit board.

Thus, if a plurality of cooling fans are expected to be installed to cool a plurality of heating elements that are mounted individually on the obverse and reverse surfaces of the circuit board, the cooling fans are normally supposed to be mounted independently of one another and in different height regions in the case.

According to the electronic apparatus constructed in this manner, the thickness of the case is influenced by those ones of the cooling fans which are mounted in the highest and lowest positions, individually.

If the one cooling fan 31 is mounted within the thickness range of the other cooling fan 21, as in the present embodiment, on the other hand, the thickness of the case 4 that contains the cooling fans 21 and 31 is capable of being reduced according to that of the thicker cooling fan 21. Thus, the electronic apparatus can be reduced in thickness.

The first and second cooling fans 21 and 31 correspond, respectively, to the first and second heating elements 13 and 14 that are separately mounted on the obverse and reverse surfaces 12a and 12b of the circuit board 12. According to the present embodiment, the circuit board 12 is provided with the cut-off portions 26 and 36, and the first and second cooling fans 21 and 31 are located in the cut-off portions 26 and 36, respectively. By doing this, the cooling fans 21 and 31 that may be originally separately arranged above and below the circuit board 12 are located so as to overlap each other in a direction parallel to the surfaces 12a and 12b of the circuit board 12. Since the first and second cooling fans 21 and 31 are thus made to overlap each other in the direction parallel to the surfaces 12a and 12b of the circuit board 12, a structure can be designed such that the one cooling fan 31 is mounted within the range of the thickness H1 of the other cooling fan 21.

Likewise, if the one radiator 32 is mounted within the thickness range of the other radiator 22, the thickness of the case 4 that contains the radiators 22 and 32 can be reduced according to that of the thicker radiator 22. Thus, the electronic apparatus is capable of being reduced in thickness.

In the present embodiment, the first heating element 13 is lager in energy consumption than the second heating element 14. In other words, the sizes and mounting height positions of the cooling fans 21 and 31 are set so that the first cooling fan 21 corresponding to the heating element 13 that requires the largest energy consumption is the largest of all cooling fans in the distances between the upper surface of the cooling fan and the first surface 12a of the circuit board 12 and between the lower surface of the cooling fan and the second surface 12b of the circuit board 12.

According to the electronic apparatus constructed in this manner, the heating element 14 with smaller energy consumption is cooled by the smaller cooling fan 31, while the heating element 13 with larger energy consumption is cooled by the larger cooling fan 21. Thus, the energy consumption of each heating element agrees with the cooling performance of each cooling fan, so that the cooling efficiency of the electronic apparatus can be improved. If the first and second heating elements 13 and 14 are deviated from each other in a direction perpendicular to the surfaces 12a and 12b of the circuit board 12, their mounting positions have generous degrees of freedom.

A portable computer 1 as an electronic apparatus according to a second embodiment of the invention will now be described with reference to FIG. 4. Like reference numbers are used to designate those structures which have the same or similar functions as those of the portable computer according to the first embodiment, and a description of those structures is omitted. The second embodiment differs from the first embodiment only in the sizes of a second cooling fan 31 and a second radiator 32. Thus, the portable computer 1 of the second embodiment has the same basic configuration as that of the first embodiment.

The portable computer 1 is provided with first and second heating elements 13 and 14 and first and second cooling units 15 and 16. As shown in FIG. 4, the second cooling fan 31 is mounted so as to be situated within a range of the thickness H1 (i.e., the thickness range) of a first cooling fan 21. In the present embodiment, for examples a thickness H2 of the second cooling fan 31 is equal to a thickness H1 of the first cooling fan 21. More specifically, a distance A2 between an upper surface 31a of the second cooling fan 31 and a first surface 12a of a circuit board 12 is equal to a distance A1 between an upper surface 21a of the first cooling fan 21 and the first surface 12a. A distance A4 between a lower surface 31b of the second cooling fan 31 and a second surface 12b of the circuit board 12 is equal to a distance A3 between a lower surface 21b of the first cooling fan 21 and the second surface 12b.

Figure 4:
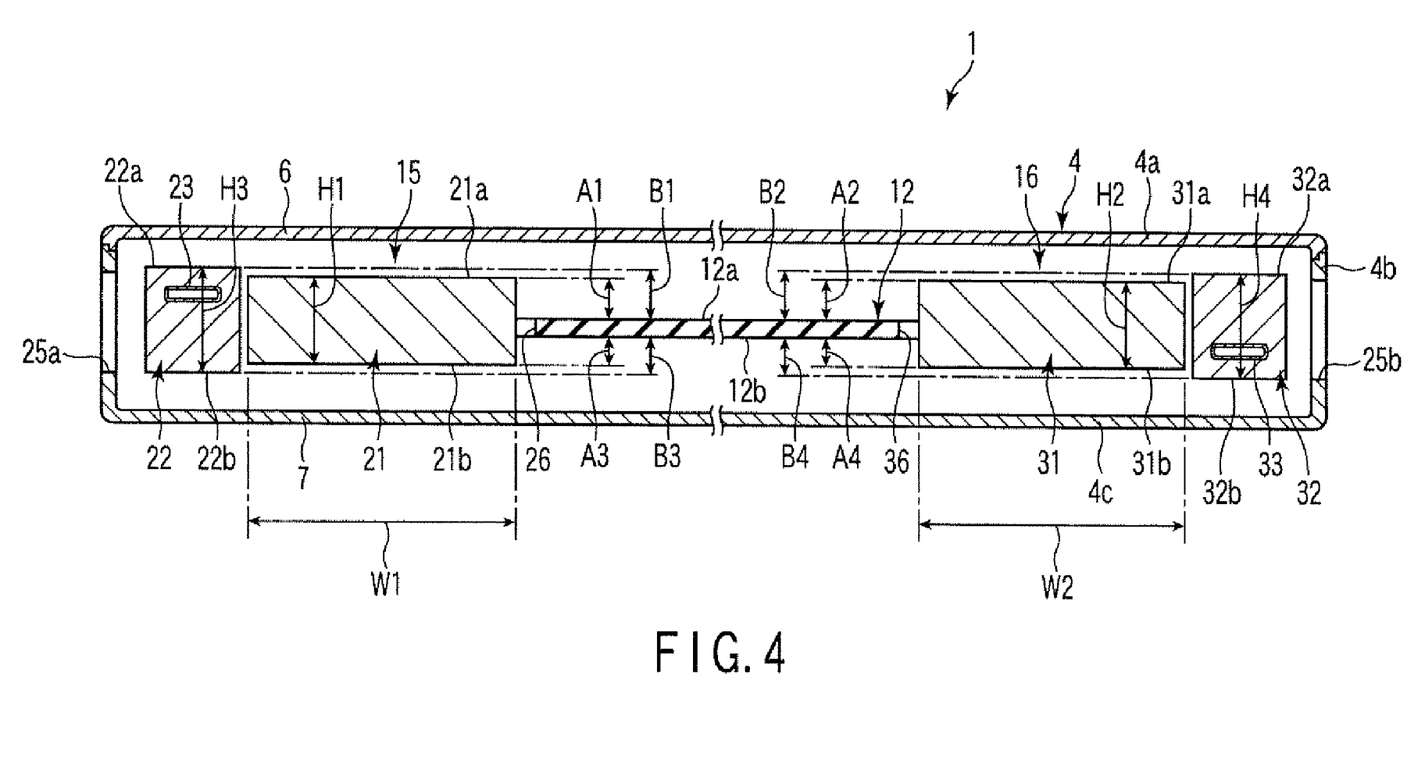
FIG. 4 is an exemplary sectional view of a portable computer according to a second embodiment of the invention.

As shown in FIG. 4, moreover, the second radiator 32 is mounted so as to be situated within a range of the thickness H3 (i.e., the thickness range) of a first radiator 22. In the present embodiment, for example, a thickness H4 of the second radiator 32 is equal to a thickness H3 of the first radiator 22. More specifically, a distance B2 between an upper surface 32a of the second radiator 32 and the first surface 12a of the circuit board 12 is equal to a distance B1 between an upper surface 22a of the first radiator 22 and the first surface 12a. A distance B4 between a lower surface 32b of the second radiator 32 and the second surface 12b of the circuit board 12 is equal to a distance B3 between a lower surface 22b of the first radiator 22 and the second surface 12b.

According to the portable computer 1 constructed in this manner, as in the first embodiment, the electronic apparatus is capable of being reduced in thickness. The configuration of the present embodiment is particularly effective if the first and second heating elements 13 and 14 are substantially equal in energy consumption, for example. Even if the heating elements 13 and 14 are different in energy consumption, moreover, an effective allowance can be given to the cooling performance of the electronic apparatus without making the case 4 thicker than that of the first embodiment.

Modifications of the first and second embodiments will now be described with reference to FIGS. 5 and 6.

Figure 5:
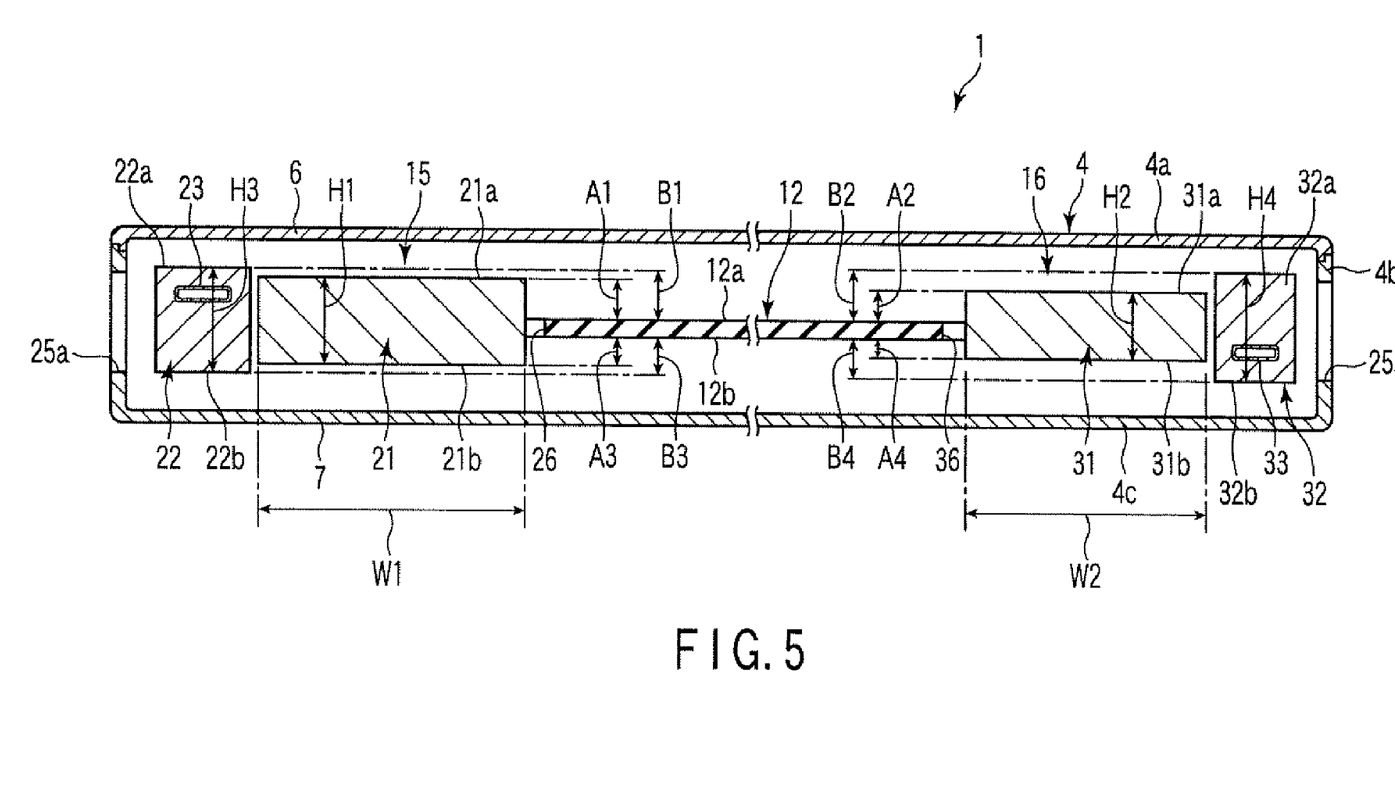
FIG. 5 is an exemplary sectional view of a portable computer according to a modification of the invention.

FIG. 5 shows a first modification. In the first modification shown in FIG. 5, the thickness H2 of the second cooling fan 31 is smaller than the thickness H1 of the first cooling fan 21, as in the first embodiment. The second cooling fan 31 is located so as to overlap the first cooling fan 21 in a direction parallel to the surfaces 12a and 12b of the circuit board 12. The second cooling fan 31 is mounted so as to be situated within a range of the thickness range H1 of the first cooling fan 21.

In the first modification shown in FIG. 5, the thickness H4 of the second radiator 32 is equal to the thickness H3 of the first radiator 22, as in the second embodiment. The second radiator 32 is located so as to overlap the first radiator 22 in a direction parallel to the surfaces 12a and 12b of the circuit board 12. The second radiator 32 is mounted so as to be situated within a range of the thickness H3 of the first radiator 22.

Figure 6:
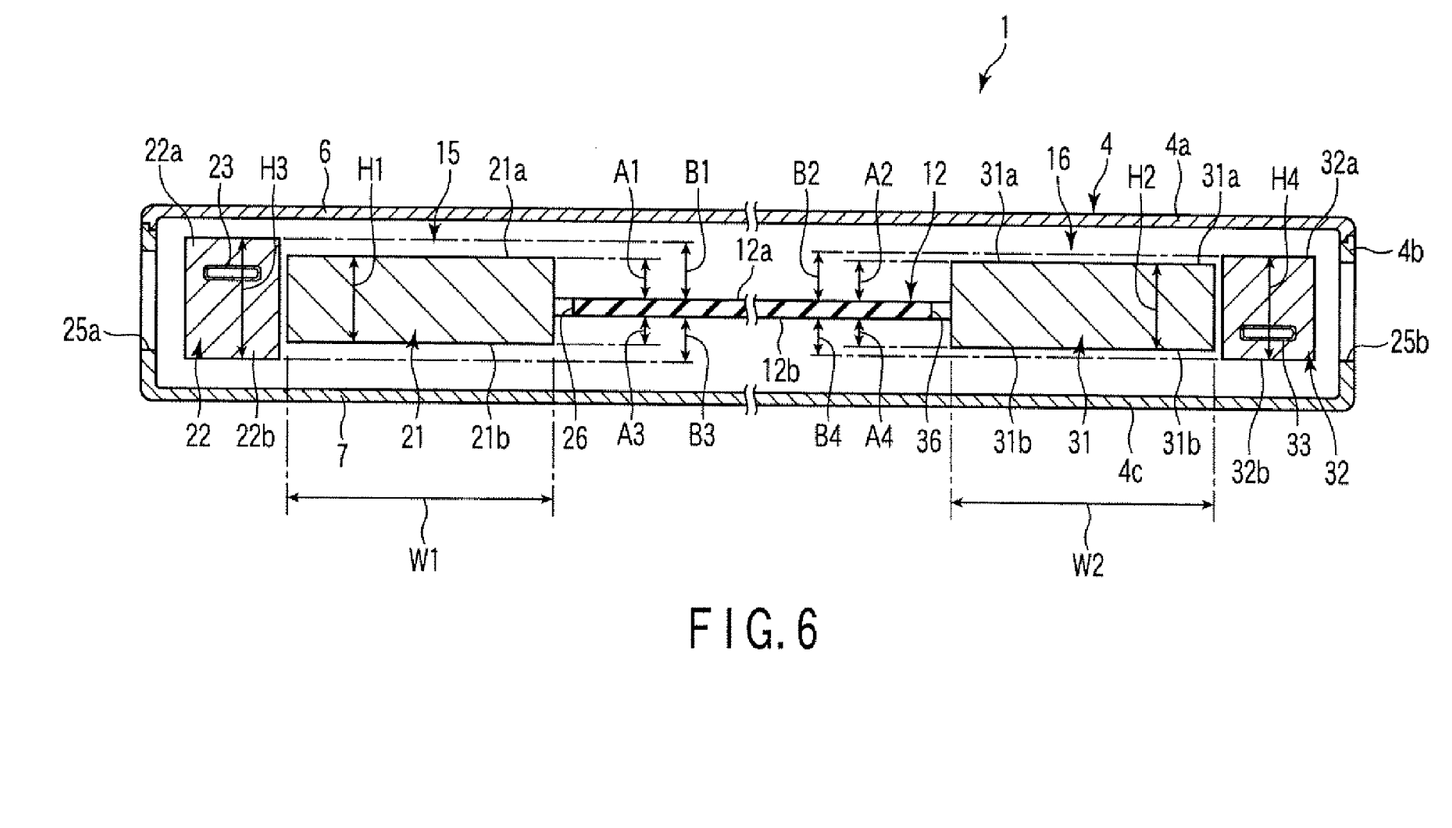
FIG. 6 is an exemplary sectional view of a portable computer according to another modification of the invention.

FIG. 6 shows a second modification. In the second modification shown in FIG. 6, the thickness H2 of the second cooling fan 31 is equal to the thickness H1 of the first cooling fan 21, as in the second embodiment. The second cooling fan 31 is located so as to overlap the first cooling fan 21 in a direction parallel to the surfaces 12a and 12b of the circuit board 12. The second cooling fan 31 is mounted so as to be situated within a range of the thickness H1 of the first cooling fan 21.

In the second modification shown in FIG. 6, moreover, the thickness H4 of the second radiator 32 is smaller than the thickness H3 of the first radiator 22, as in the first embodiment. The second radiator 32 is located so as to overlap the first radiator 22 in a direction parallel to the surfaces 12a and 12b of the circuit board 12. The second radiator 32 is mounted so as to be situated within a range of thickness H3 of the first radiator 22.

In the first and second modifications, structures other than the specifically described ones are the same as those of the first embodiment.

Figure 7:
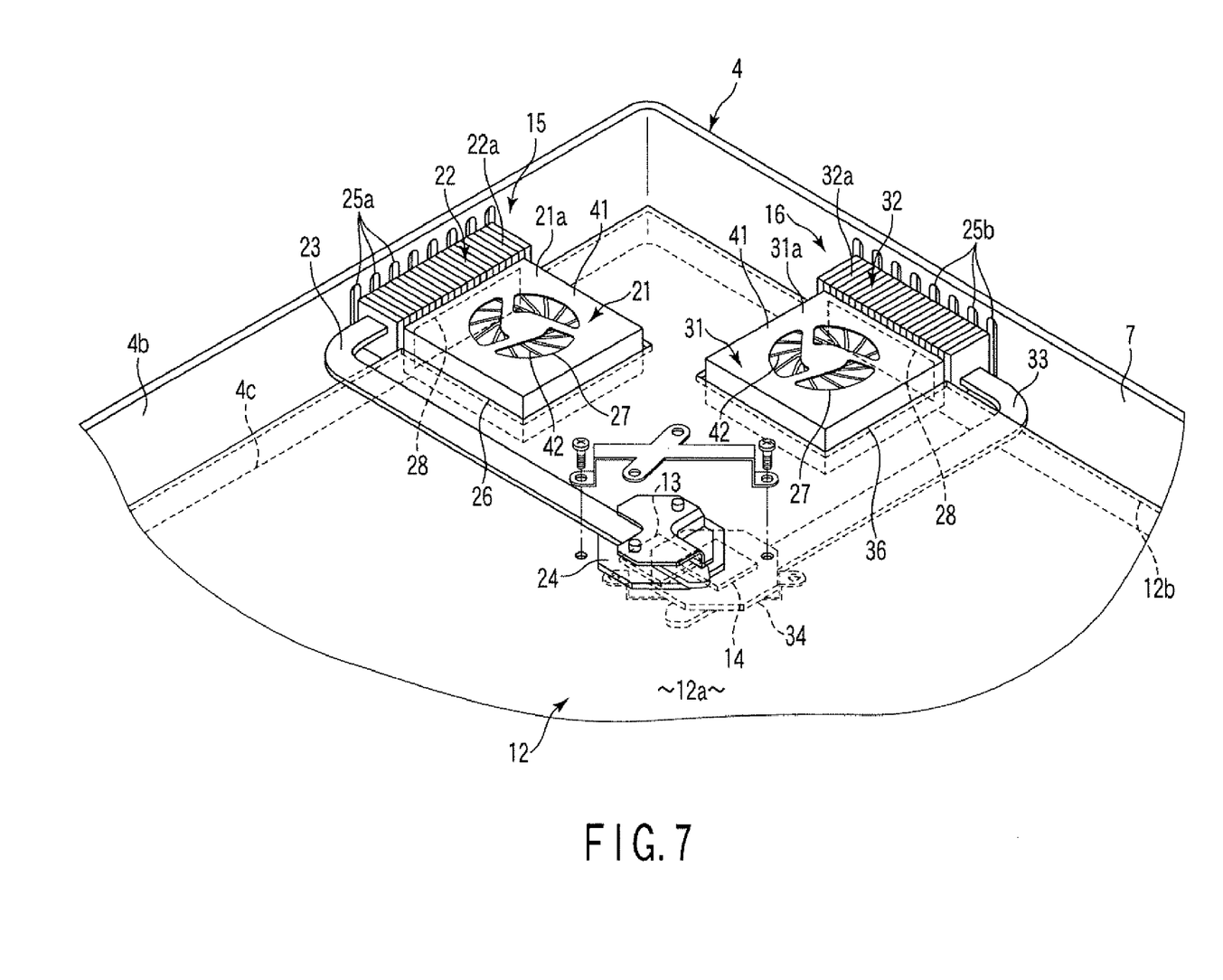
FIG. 7 is an exemplary sectional view of the interior of a portable computer according to a third embodiment of the invention.

A portable computer 1 as an electronic apparatus according to a third embodiment of the invention will now be described with reference to FIG. 7. Like reference numbers are used to designate those structures which have the same or similar functions as those of the portable computer according to the first embodiment, and a description of those structures is omitted. The third embodiment differs from the first and second embodiments only in the mounting positions of first and second heating elements 13 and 14. Thus, the portable computer 1 of the third embodiment has the same basic configuration as that of the first embodiment.

The portable computer 1 is provided with the first and second heating elements 13 and 14 and first and second cooling units 15 and 16. As shown in FIG. 7, the first and second heating elements 13 and 14 according to the present embodiment at least partially overlap each other in a direction perpendicular to surfaces 12a and 12b of a circuit board 12 (e.g., vertically).

In the present embodiment, a second cooling fan 31 has a thickness equal to or smaller than that of a first cooling fan 21. Specifically, the first and second cooling fans 21 and 31 according to the present embodiment may be correlated so that a thickness H2 of the second cooling fan 31 may be smaller than a thickness H1 of the first cooling fan 21, as in the first embodiment, or that the thicknesses H1 and H2 may be equal, as in the second embodiment.

More specifically, a distance A2 between an upper surface 31a of the second cooling fan 31 and the first surface 12a of the circuit board 12 is equal to or shorter than a distance A1 between an upper surface 21a of the first cooling fan 21 and the first surface 12a. A distance A4 between a lower surface 31b of the second cooling fan 31 and the second surface 12b of the circuit board 12 is equal to or shorter than a distance A3 between a lower surface 21b of the first cooling fan 21 and the second surface 12b.

Likewise, in the present embodiment, radiators 22 and 32 are correlated so that the thickness of the second radiator 32 is equal to or smaller than that of the first radiator 22. Thus, a thickness H4 of the second radiator 32 may be smaller than a thickness H3 of the first radiator 22, as in the first embodiment, or the thicknesses H3 and H4 may be equal, as in the second embodiment.

More specifically, a distance B2 between an upper surface 32a of the second radiator 32 and the first surface 12a of the circuit board 12 is equal to or shorter than a distance B1 between an upper surface 22a of the first radiator 22 and the first surface 12a. A distance B4 between a lower surface 32b of the second radiator 32 and the second surface 12b of the circuit board 12 is equal to or shorter than a distance B3 between a lower surface 22b of the first radiator 22 and the second surface 12b.

According to the portable computer 1 constructed in this manner, as in the first and second embodiments, the electronic apparatus is capable of being reduced in thickness. Further, the mounting area of the circuit board 12 is capable of being reduced if the first and second heating elements 13 and 14 are mounted so that they at least partially overlap each other in the direction perpendicular to the surfaces 12a and 12b of the circuit board 12. Thus, the electronic apparatus is capable of being further reduced in size and thickness.

Although there have been described the portable computers 1 according to the first to third embodiments of the present invention, the invention is not limited to these embodiments. The components according to the individual embodiments may be combined as required.

The electronic apparatuses according to the first to third embodiments have been described as being mounted with two cooling fans each. In an electronic apparatus that is mounted with, for example, three or more cooling fans, however, the sizes and mounting height positions of the cooling fans are set so that the first cooling fan corresponding to the heating element that requires the largest energy consumption is the largest of all cooling fans in the distances between the upper surface of the cooling fan and the first surface 12a of the circuit board 12 and between the lower surface of the cooling fan and the second surface 12b of the circuit board 12. In this case, two relatively small cooling fans are confined within a range of the thickness of one relatively large cooling fan.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic apparatus comprising:
   a case;
   a printed circuit board which is contained in the case and includes a first surface and a second surface formed on the side opposite from the first surface;
   a first heating element mounted on the first surface of the circuit board;
   a second heating element mounted on the second surface of the circuit board;
   a first cooling fan used to cool the first heating element; and
   a second cooling fan used to cool the second heating element,
   a thickness of the second cooling fan being smaller than a thickness of the first cooling fan, the second cooling fan being mounted so as to overlap the first cooling fan in a direction parallel to the first surface of the circuit board and be situated within a range of the thickness of the first cooling fan.

2. An electronic apparatus according to claim 1, further comprising:
   a first radiator which is thermally connected to the first heating element and cooled by the first cooling fan, and
   a second radiator which is thermally connected to the second heating element and cooled by the second cooling fan, and wherein
   a thickness of the second radiator is smaller than a thickness of the first radiator, and the second radiator is mounted so as to overlap the first radiator in a direction parallel to the first surface of the circuit board and be situated within a range of the thickness of the first radiator.

3. An electronic apparatus according to claim 1, further comprising:
   a first radiator which is thermally connected to the first heating element and cooled by the first cooling fan, and
   a second radiator which is thermally connected to the second heating element and cooled by the second cooling fan, and wherein
   a thickness of the second radiator is equal to a thickness of the first radiator, and the second radiator is mounted so as to overlap the first radiator in a direction parallel to the first surface of the circuit board and be situated within a range of the thickness of the first radiator.

4. An electronic apparatus according to claim 1, wherein the first heating element is larger in energy consumption than the second heating element.

5. An electronic apparatus according to claim 1, wherein the first heating element and the second heating element at least partially overlap each other in a direction perpendicular to the first surface of the circuit board.

6. An electronic apparatus according to claim 1, wherein the first heating element and the second heating element are deviated from each other in a direction perpendicular to the first surface of the circuit board.

7. An electronic apparatus comprising:
   a case;
   a printed circuit board which is contained in the case and includes a first surface and a second surface formed on the side opposite from the first surface;
   a first heating element mounted on the first surface of the circuit board;
   a second heating element mounted on the second surface of the circuit board;
   a first cooling fan used to cool the first heating element; and
   a second cooling fan used to cool the second heating element,
   a thickness of the second cooling fan being equal to a thickness of the first cooling fan, the second cooling fan being mounted so as to overlap the first cooling fan in a direction parallel to the first surface of the circuit board and be situated within a range of the thickness of the first cooling fan.

8. An electronic apparatus according to claim 7, further comprising:
   a first radiator which is thermally connected to the first heating element and cooled by the first cooling fan, and
   a second radiator which is thermally connected to the second heating element and cooled by the second cooling fan, and wherein a thickness of the second radiator is smaller than a thickness of the first radiator, and the second radiator is mounted so as to overlap the first radiator in a direction parallel to the first surface of the circuit board and be situated within a range of the thickness of the first radiator.

9. An electronic apparatus according to claim 7, further comprising:

a first radiator which is thermally connected to the first heating element and cooled by the first cooling fan, and a second radiator which is thermally connected to the second heating element and cooled by the second cooling fan, and wherein a thickness of the second radiator is equal to a thickness of the first radiator, and the second radiator is mounted so as to overlap the first radiator in a direction parallel to the first surface of the circuit board and be situated within a range of the thickness of the first radiator.

* * * * *